(12) United States Patent
Savio

(10) Patent No.: US 10,225,156 B2
(45) Date of Patent: Mar. 5, 2019

(54) TESTING A CLOUD SERVICE COMPONENT ON A CLOUD PLATFORM

(71) Applicant: Hewlett Packard Enterprise Development LP, Houston, TX (US)

(72) Inventor: Alex Dominic Savio, Bangalore (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 157 days.

(21) Appl. No.: 15/313,763

(22) PCT Filed: Aug. 26, 2014

(86) PCT No.: PCT/US2014/052714
§ 371 (c)(1),
(2) Date: Nov. 23, 2016

(87) PCT Pub. No.: WO2015/199744
PCT Pub. Date: Dec. 30, 2015

(65) Prior Publication Data
US 2017/0201427 A1      Jul. 13, 2017

(30) Foreign Application Priority Data

Jun. 27, 2014   (IN) .......................... 3136/CHE/2014

(51) Int. Cl.
| | | |
|---|---|---|
| *H04L 12/24* | (2006.01) | |
| *G06F 17/50* | (2006.01) | |
| *G06F 11/26* | (2006.01) | |
| *H04L 12/26* | (2006.01) | |
| *H04L 29/08* | (2006.01) | |

(52) U.S. Cl.
CPC ............ *H04L 41/145* (2013.01); *G06F 11/26* (2013.01); *G06F 11/261* (2013.01); *G06F 17/50* (2013.01); *H04L 41/12* (2013.01); *H04L 43/50* (2013.01); *H04L 67/10* (2013.01)

(58) Field of Classification Search
CPC ....... H04L 41/12; H04L 41/145; H04L 67/10; G06F 11/26
USPC ......................................................... 709/224
See application file for complete search history.

(56) References Cited

U.S. PATENT DOCUMENTS

| | | | |
|---|---|---|---|
| 2010/0319004 A1 | 12/2010 | Hudson et al. | |
| 2012/0109772 A1 | 5/2012 | Chernenko et al. | |
| 2013/0080999 A1* | 3/2013 | Yang ................... | G06F 11/3664 717/124 |

(Continued)

FOREIGN PATENT DOCUMENTS

| | | |
|---|---|---|
| CN | 103259812 | 8/2013 |
| WO | WO-2013184137 A1 | 12/2013 |

OTHER PUBLICATIONS

Cole, Arthur, "Better Together: Virtualization and the Cloud", QuinStreet Inc, Dec. 18, 2008, 4 pages.

(Continued)

*Primary Examiner* — Glenford J Madamba
(74) *Attorney, Agent, or Firm* — Brooks, Cameron & Huebsch, PLLC

(57) ABSTRACT

Some examples described herein relate to testing of a cloud service component on a cloud platform. A simulation tool may be configured on the cloud platform. The simulation tool may be used to test the cloud service component upon inclusion of said cloud service component in a cloud service topology created on the cloud platform.

14 Claims, 6 Drawing Sheets

(56) References Cited

U.S. PATENT DOCUMENTS

2013/0173962 A1    7/2013   Li et al.
2013/0283265 A1   10/2013   Acharya et al.
2014/0026122 A1*   1/2014   Markande ........... G06F 11/3664
                                                                                                717/124
2014/0033268 A1    1/2014   Julisch et al.

OTHER PUBLICATIONS

Korean Intellectual Property Office, International Search Report and Written Opinion, dated Feb. 24, 2015, 12 pages.

* cited by examiner

TESTING A CLOUD SERVICE COMPONENT ON A CLOUD PLATFORM

BACKGROUND

Cloud computing has brought in a new style of IT for the enterprises. Generally speaking, cloud computing involves delivery of computing as a service rather than a product, whereby shared resources (software, storage resources, etc.) are provided to computing devices as a service. The resources are shared over a network such as the internet. Cloud computing thus provides a quick and scalable access to computing resources and information technology (IT) services.

BRIEF DESCRIPTION OF THE DRAWINGS

For a better understanding of the solution, embodiments will now be described, purely by way of example, with reference to the accompanying drawings, in which.

DETAILED DESCRIPTION OF THE INVENTION

Figure 1:
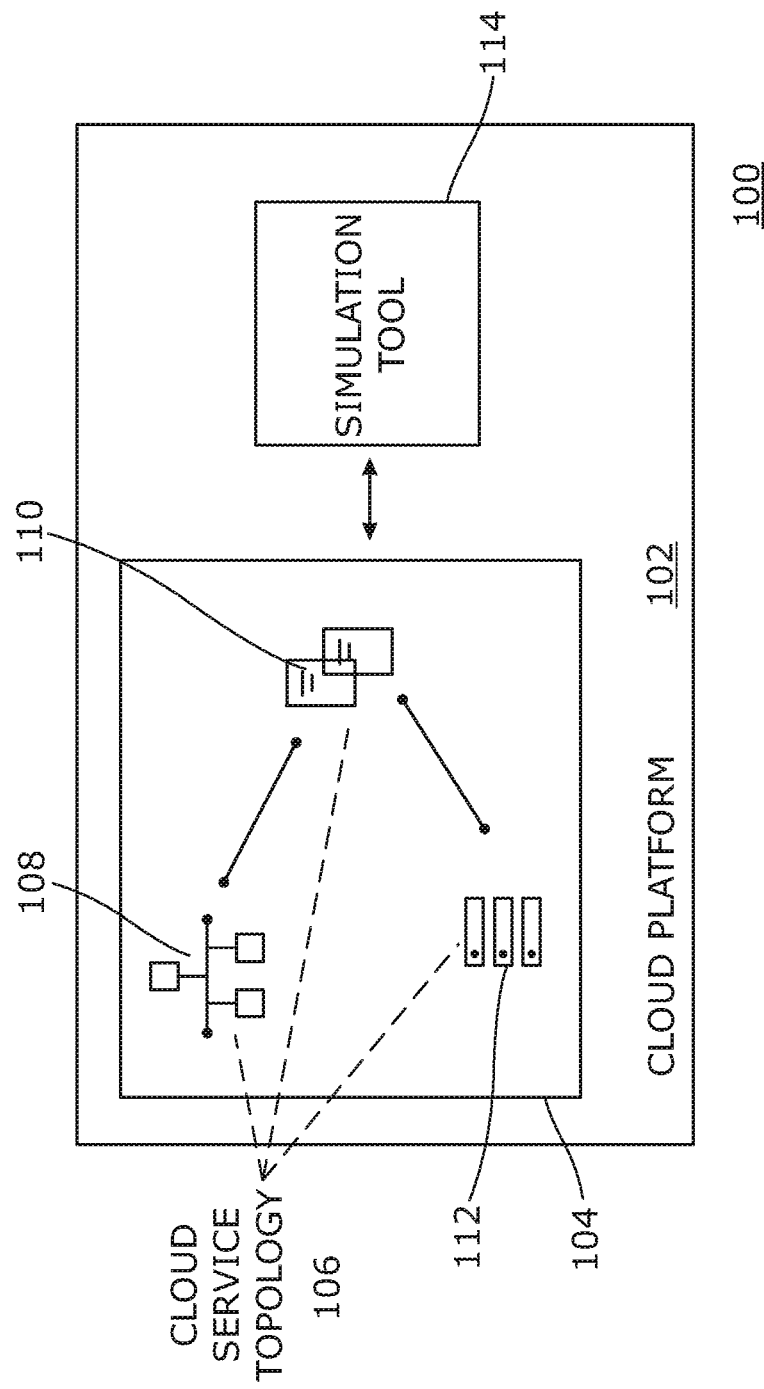
FIG. 1 is a block diagram of an example computing environment for testing a cloud service component on a cloud platform.

Cloud computing is a delivery model for technology-enabled services that provides on-demand and pay-as-you-use access to an elastic pool of shared computing resources. Some examples of such resources may include applications, servers, storage, networks, etc. Cloud computing allows rapid provisioning of computing resources that could be scaled up or down depending on the requirements of a customer. Thus, these assets may be consumed "as a service".

There are many models of cloud computing such as Infrastructure-as-a-Service (IaaS), Platform-as-a-Service (PaaS) and Software-as-a-Service (SaaS), Depending on a client's requirement, a cloud service provider may provide either of the aforementioned services each of which may require provisioning of certain resources on a cloud. For instance, in case of a client request for deployment of an application (for example, an email application) on a cloud, a cloud service provider may provision infrastructure resources (for example, a virtual server) and platform resources in order to deploy the application.

However, this new style of IT has brought in a number of challenges for the development and testing teams. These include compressed release cycles, decreasing time to market, reducing defects in production, shortening software development life cycles, etc. In the context of a cloud service, before a cloud topology is offered as service, it may need to be tested and any topology design may need to undergo a lifecycle of development, quality assurance, stage, and production phase. Also, many a time, a cloud service offering may involve interdependency between various functional components some of which may require an external resource for testing. However, it may not always be possible to have access to an external resource to test functional or performance capability of a service component during each stage of a topology design. Further, reliance on services provided by third-party vendors to validate a service component(s) of a cloud service offering may not be a desirable situation since apart from other issues it may pose security and access concerns. In addition, a third-party resource (or service) provider may use pay-per-transaction access model to charge for testing a service component which may be costly.

To address these issues, the present disclosure describes various examples for testing a cloud service component on a cloud platform. In an example, a simulation tool for testing a cloud service component may be configured on the cloud platform. The simulation tool may be used to test the cloud service component after the cloud service component is included in a cloud service topology, which may be created on the cloud platform.

The example implementations mentioned herein may reduce the waiting time required for testing a cloud service component once it is created. They may also help save on the requirements to procure additional infrastructure, license and maintenance costs for testing a component. Further, since each component's functionality and performance may be tested, any issue upon inclusion of a new service component may be easily identified and corrected.

FIG. 1 is a block diagram of an example computing environment 100 for testing a cloud service component on a cloud platform. Computing environment 100 may include a cloud platform 102. In an example, computing environment 100 may be a cloud network or cloud system ("cloud") that may be a private cloud, a public cloud, or a hybrid cloud. To explain briefly, a cloud system may be termed as public cloud if cloud computing services are rendered over a public network such as the internet. On the other hand, a private cloud is a proprietary network that supplies services to a specific set of users. A hybrid cloud combines private and public cloud services, Cloud platform 102 may refer to an underlying software and/or hardware platform that allows applications to run in a cloud, or use services (for example, infrastructure services, application service, and the like) provided by the cloud, or both. Cloud platform (example, 102) may provide or deploy various types of cloud services for a user or customer. These may include Infrastructure as a Service (IaaS), Platform as a Service (PaaS), Software as a Service (SaaS), and so forth. In order to provide an aforementioned service, cloud platform (example, 102) may include various types of computing resources. These computing resources may be hardware resources, software resources, or any combinations thereof. For example, hardware resources may include computer systems, computer servers, workstations, or any other computer devices. And, software resources may include operating system software (machine executable instructions), firmware, and/or application software. Computing resources may also include virtual machines, virtual servers, storage resources, load balancers, firewalls, etc.

Cloud platform (example, 102) may be used by a user or customer to request a new cloud service and manage an existing cloud service. Users may also use the cloud platform (example, 102) to view status of a pending cloud service request, pending approvals, and approved service subscriptions. Users may also use the cloud platform (example, 102) to request modifications in a cloud service subscription, cancel a cloud service subscription, and perform other actions related to their cloud services. In other words, cloud platform (example, 102) may be used to design, publish, and manage a cloud service(s).

Cloud platform (example, 102) may include a cloud service designer module 104. The term "module" may refer to a software component (machine executable instructions), a hardware component or a combination thereof, A module may include, by way of example, components, such as software components, processes, tasks, co-routines, functions, attributes, procedures, drivers, firmware, data, databases, data structures, Application Specific Integrated Circuits (ASIC) and other computing devices. The module may reside on a volatile or non-volatile storage medium and configured to interact with a processor of a computing device.

Cloud service designer module (example, 104) may be used by a user to design a cloud service topology 106. A cloud service topology (example, 106) specifies cloud service components (example, 108, 110, and 112) and their relationships to define a cloud service lifecycle. In other words, a cloud service topology (example, 106) may represent the initial configuration for a cloud service offering which may be offered via the cloud platform (example, 102). A cloud service topology (example, 106) provides a structure for options or profiles related to cloud service component (example, 108, 110, or 112) that a consumer may select when ordering a service.

Figure 2:
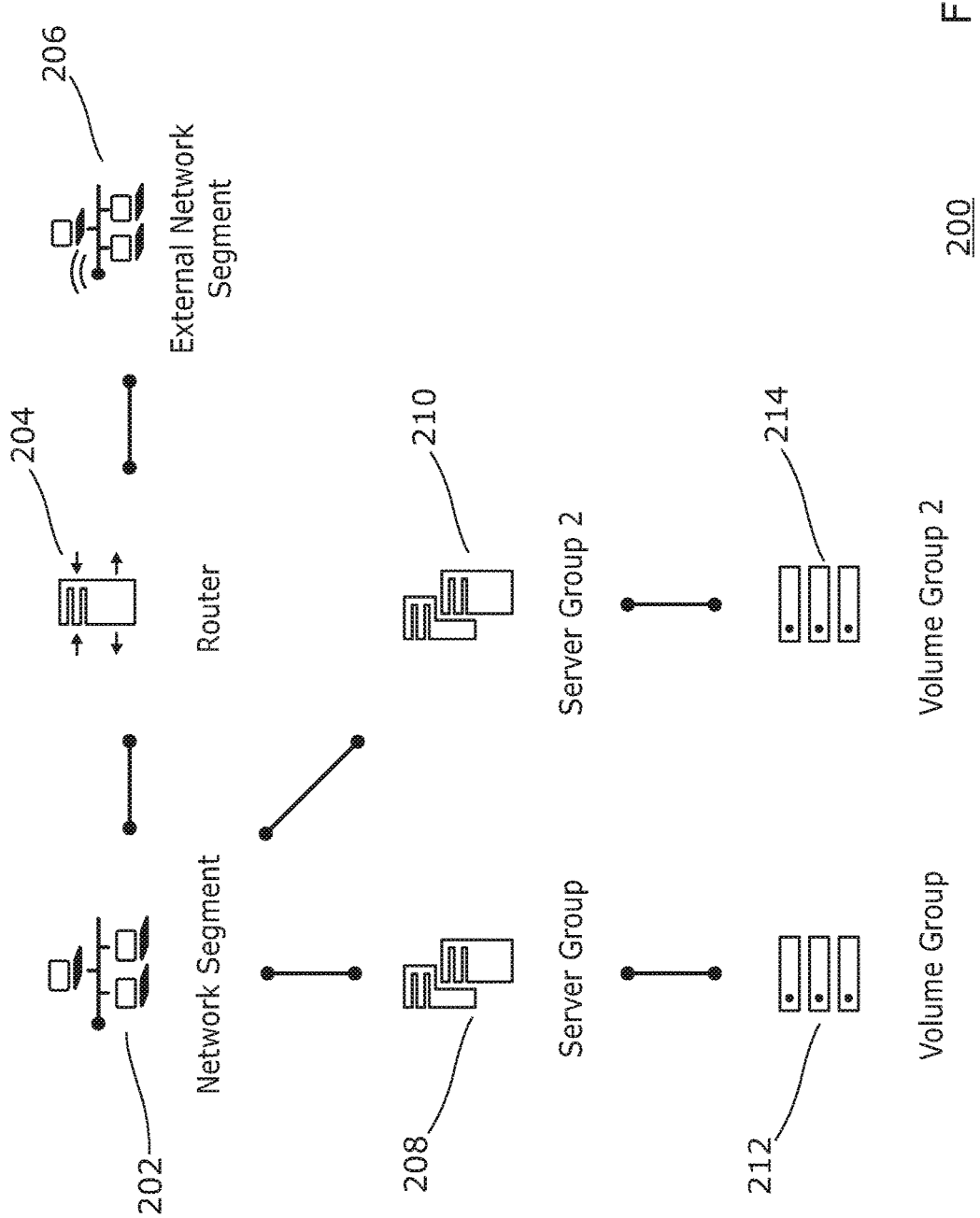
FIG. 2 is a diagram of an example cloud service topology on a cloud platform.

A cloud service component (example, 108, 110, or 112) may refer to a component (software or hardware) required to enable a cloud service. For example, a cloud service component (example, 108, 110, or 112) may include a front end component (for example, computer system, mobile device-.etc.), a back end platform (for example, server, storage, etc.), a network (for example, Internet, intranet, etc.), and the like. Cloud service designer module (example, 104) may be used to design a cloud service topology (example, 106) by using various service components (example, 108, 110, and 112) before it is offered as a cloud service to a customer. In other words, cloud service components (example, 108, 110, and 112) and their relationships in a cloud service topology (example, 106) may define the framework for creating a cloud service. FIG. 2 illustrates a diagram of an example cloud service topology 200, which may be created by using the cloud service designer module (example, 104). Cloud service topology 200 (similar to 106) illustrates various cloud service components (network segment 202, router 204, external network segment 206, server group 208, server group 2 (210), volume group 212, and volume 2 (214)) and their relationships. A cloud service component (example, 108, 110, or 112) may be part of a cloud platform (example, 102) or it may be imported to a cloud platform from another source.

Figure 3:
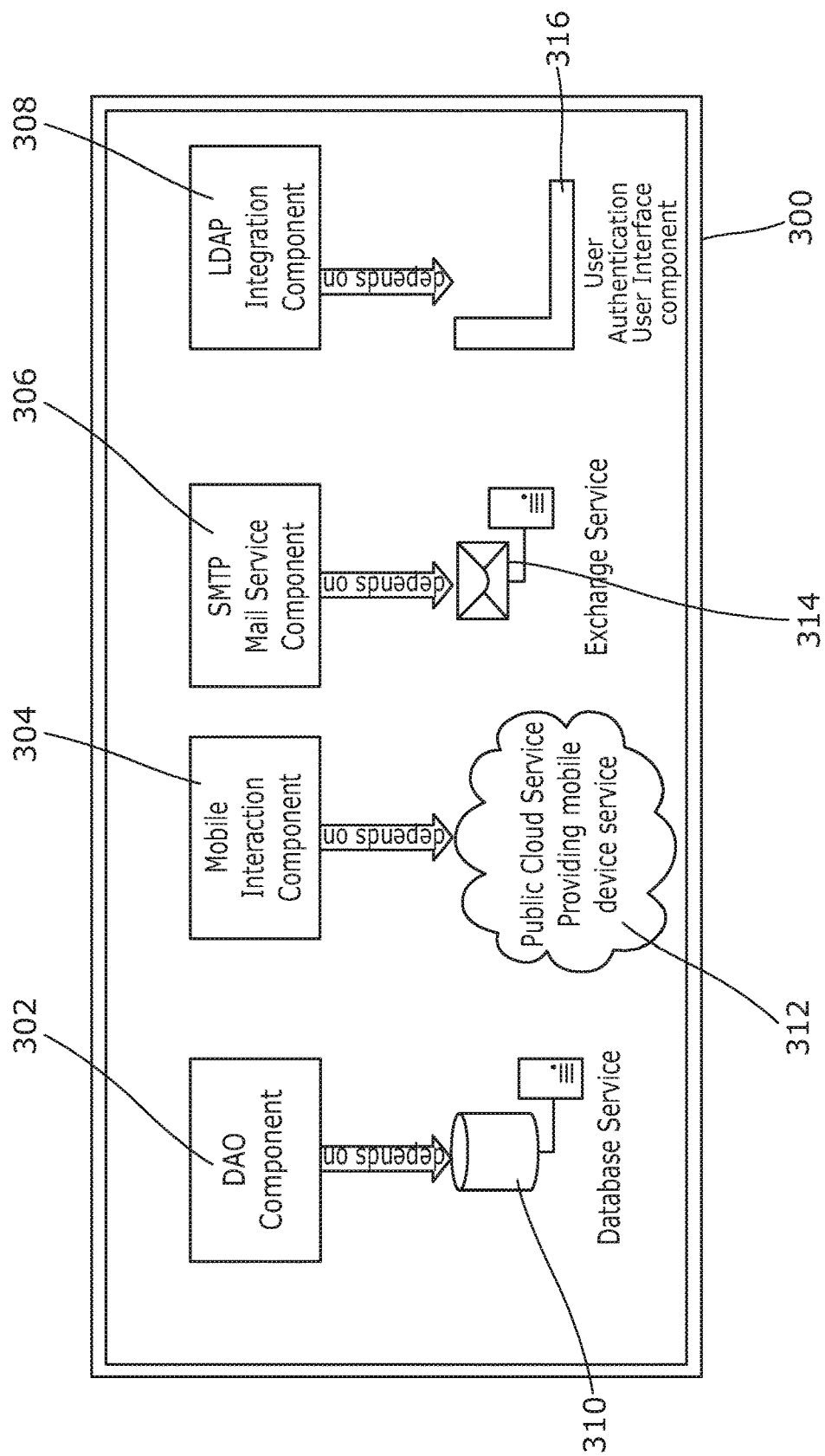
FIG. 3 is a diagram illustrating example cloud service components for an application.

In an example, a cloud service component (example, 108, 110, or 112) in a cloud platform (example, 102) may depend on a resource for its functioning. A "resource" may refer to a specific instance of software or hardware that may be required to enable a cloud service delivery through a cloud service component (example, 108, 110, or 112). FIG. 3 illustrates various service components and their respective resources for an application 300, according to an example. Application 300 includes various service components: Data Access Objects (DAO) 302, mobile interaction component 304, SMTP mail service component 306, and LDAP integration component 308. Each of the aforesaid components may depend on a respective resource, which may be, for instance, a database service 310, a public cloud service providing a mobile device service 312, an exchange service 314, and a user authentication user interface component 316, respectively.

Referring to FIG. 1, a simulation tool(s) or test service 114 may be configured on the cloud platform (example, 102) to test or validate a cloud service topology (example, 106) or a cloud service component (example, 108, 110, or 112) on the cloud platform (example, 102). For example, a database simulation tool may be configured on the cloud platform (example, 102) to test a DAO component. In another example, an exchange simulation tool may be configured to test an SMTP mail service component. A simulation tool (example, 114) may simulate the data, performance, and behavior of a service component in order to test, by way of non-limiting examples, a function, performance, or security feature of a service component. Simulation tool (example, 114) may model data, performance, and network behavior of a cloud service topology (example, 106) or a cloud service component (example, 108, 110, or 112). Simulation tool (example, 114) may also perform load testing of a cloud service component. In an example, simulation tool (example, 114) may be a virtual service that may simulate a real service behavior of a resource required by a cloud service component. Thus, simulation tool v may be used when due to some reason (for example, security or compliance), a real service or resource may not be available to test a cloud service component. In other words, simulation tools(s) (example, 114) may simulate a service provided by a resource to a dependent cloud service element. For instance, in reference to FIG. 3, simulation tool (example, 114) may simulate services provided by a resource (e.g., database service, public cloud service providing a mobile device service, exchange service, and user authentication user interface component) to their respective dependent cloud service components (Data Access Objects (DAO), mobile interaction component, SMTP mail service component, and LDAP integration component). The aforementioned are just some of the example functions that a simulation tool (example, 114) may perform and no limitation should be read into them A simulation tool(s) or test service(s) (example, 114) configured on a cloud platform (example, 102) may be listed on the cloud platform to enable a user to select a simulation tool(s) of his or her choice for testing a cloud service component (example, 108, 110, or 112) or cloud service topology (example, 106). In an example, simulation tools (example, 114) configured on a cloud platform (example, 102) may be populated in the cloud service designer module (example, 104) upon selection or inclusion of a cloud service component (example, 108, 110, or 112) in a cloud service topology (example, 106) on the cloud platform (example, 102). For instance, a simulation tool (example, 114) may be listed when a user is creating a cloud service topology (example, 106) on the cloud platform (example, 102). In an example, simulation tool (example, 114) may be used to test a cloud service component (example, 108, 110, or 112) prior to inclusion of the cloud service component in a cloud service offered via the cloud platform (example, 102).

In an implementation, once a cloud service component or cloud topology has been tested or validated by a simulation tool (example, 114), the test results may communicated to a user, for instance in the form of a report.

Figure 4:
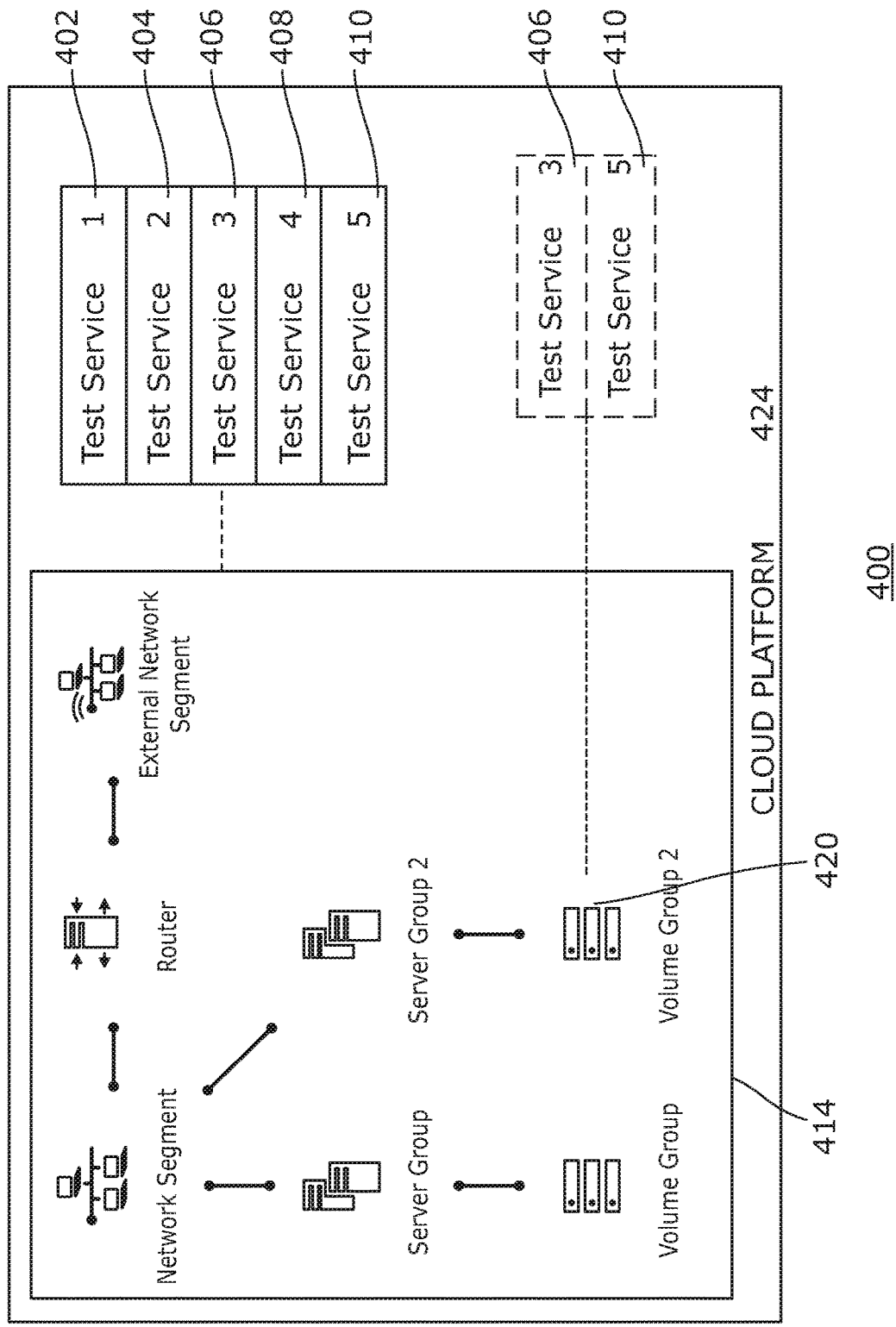
FIG. 4 is a diagram illustrating an example list of simulations tools configured on a cloud platform.

FIG. 4 is a diagram 400 illustrating a list of simulations tools configured on a cloud platform, according to an example. In an example, all simulations tools or test services 402, 404, 406, 408, and 410 that are configured on the cloud platform 424 (or 102) may be listed while creating a cloud service topology 414 (similar to 106). In another example, only those simulation tools may be listed that are relevant (406 and 410) for testing a cloud service component 420 that has been selected or included in a cloud service topology 414. A simulation tool(s) may also automatically test a cloud service component upon inclusion of said cloud service component in a cloud service topology on the cloud platform 424.

In an example, a test service configured on a cloud platform (example, 102) may be used to validate a cloud service topology (example, 106) created on the cloud platform before said topology is used as a basis of a cloud service offered via the cloud platform. In another implementation, a test service may be used to validate a cloud service topology prior to publication of said cloud service topology (example, 106) on a cloud platform (example, 102).

Figure 5:
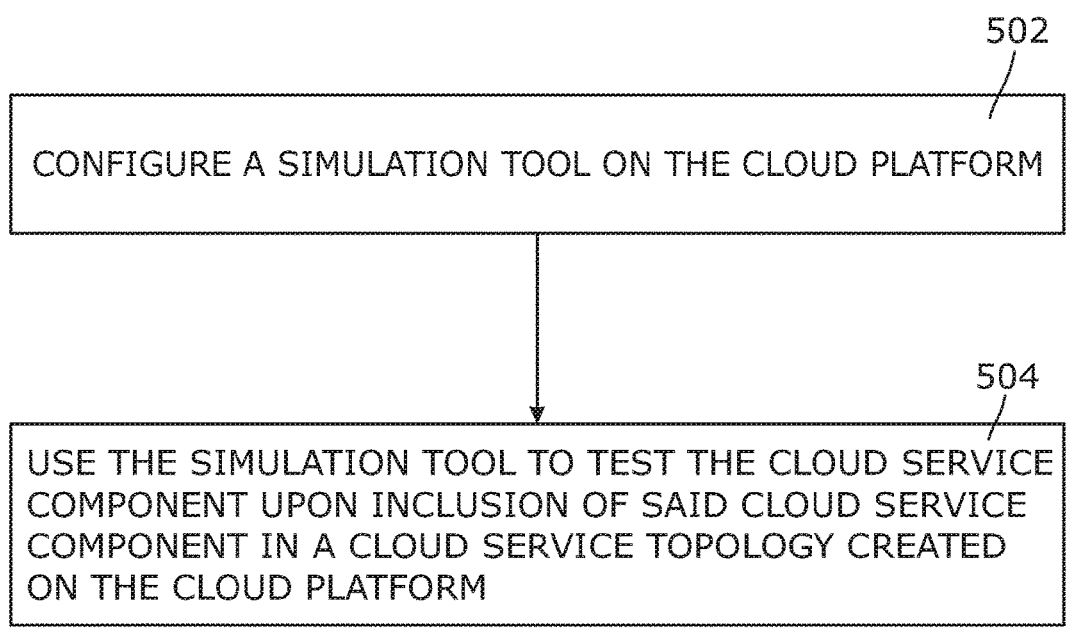
FIG. 5 is a flow chart of an example method for testing a cloud service component on a cloud platform.

FIG. 5 is a flow chart of an example method 500 for testing a cloud service component on a cloud platform. The method 500, which is described below, may be executed on a computer platform such as cloud platform 102 of FIG. 1. However, other computing platforms may be used as well. At block 502, a simulation tool(s) (example, 114) may be configured on the cloud platform (example, 102). At block 540, the simulation tool (example, 114) may be used to test a cloud service component (example, 108, 110, or 112) upon inclusion of said cloud service component in a cloud service topology (example, 106) created on the cloud platform (example, 102).

Figure 6:
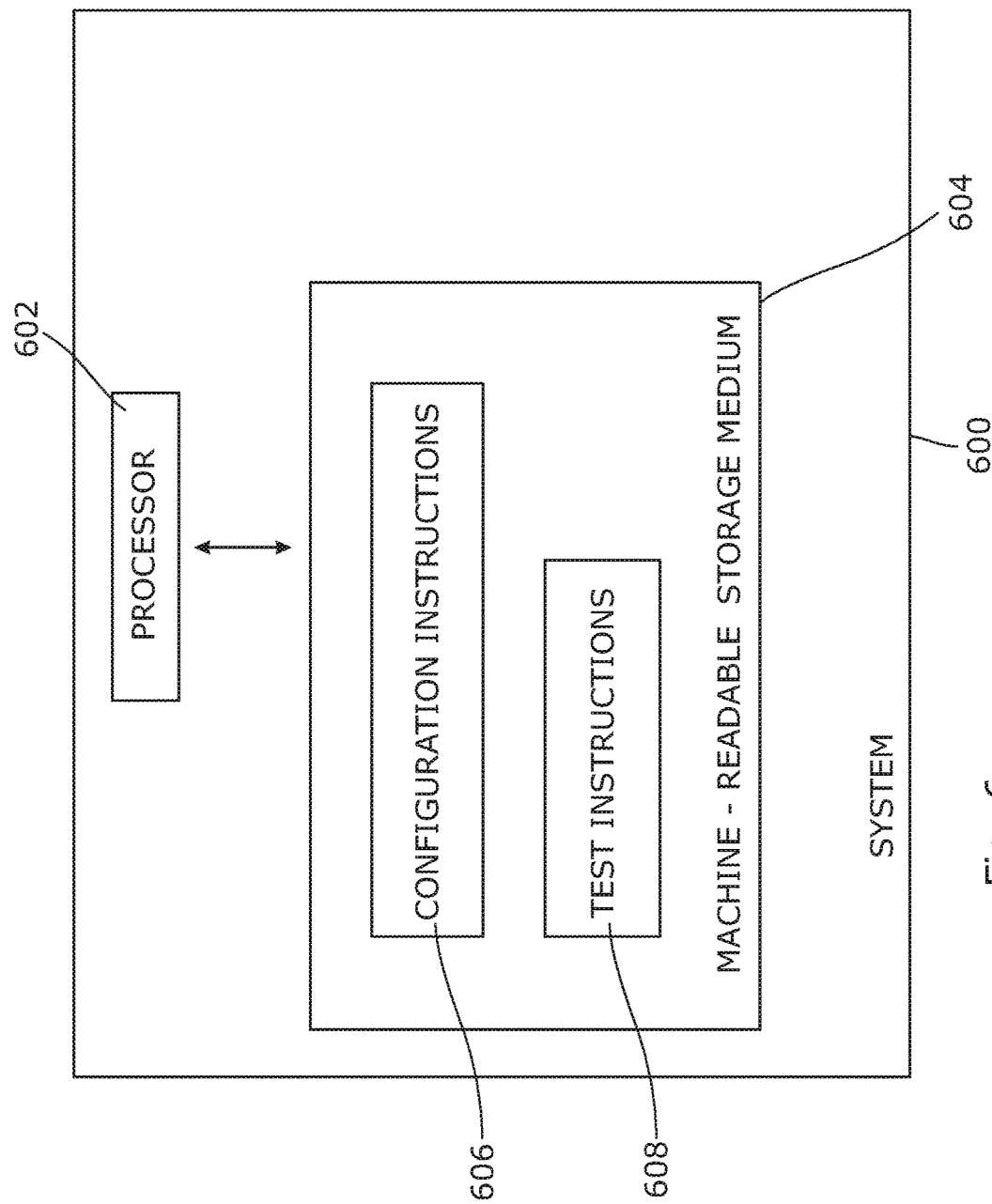
FIG. 6 is a block diagram of an example system for testing a cloud service component on a cloud platform.

FIG. 6 is a block diagram of an example system 600 for testing a cloud service component on a cloud platform. System 600 includes a processor 602 and a machine-readable storage medium 604 communicatively coupled through a system bus. Processor 602 may be any type of Central Processing Unit (CPU), microprocessor, or processing logic that interprets and executes machine-readable instructions stored in machine-readable storage medium 604. Machine-readable storage medium 604 may be a random access memory (RAM) or another type of dynamic storage device that may store information and machine-readable instructions that may be executed by processor 602. For example, machine-readable storage medium 604 may be Synchronous DRAM (SDRAM), Double Data Rate (DDR), Rambus DRAM (RDRAM), Rambus RAM, etc. or storage memory media such as a floppy disk, a hard disk, a CD-ROM, a DVD, a pen drive, and the like, In an example, machine-readable storage medium 604 may be a non-transitory machine-readable medium, In an example, machine-readable storage medium 604 may be remote but accessible to system 600.

Machine-readable storage medium 604 may store configuration instructions 606 and test instructions 608. In an example, configuration instructions 606 may be executed by processor 602 to configure a simulation tool (example, 114) on a cloud platform. Test instructions may be executed by processor 602 to use the simulation tool to test a cloud service component (example, 108, 110, or 112) further to selection of the cloud service component in a cloud service topology (example, 106) on a cloud platform (example, 102). In an example, the simulation tool (example, 114) may be used to test a functional, performance or security feature of the cloud service component. Machine-readable storage medium 604 may further store installation instructions executable by processor 602 to list the test service on the cloud platform (example, 102) for selection by a user. Machine-readable storage medium 604 may further store installation instructions executable by processor 602 to report test results of the test on the cloud service component.

For the purpose of simplicity of explanation, the example method of FIG. 5 is shown as executing serially, however it is to be understood and appreciated that the present and other examples are not limited by the illustrated order. The example systems of FIGS. 1 to 4 and 6, and method of FIG. 5 may be implemented in the form of a computer program product including computer-executable instructions, such as program code, which may be run on any suitable computing device in conjunction with a suitable operating system (for example, Microsoft Windows, Linux, UNIX, and the like). Embodiments within the scope of the present solution may also include program products comprising non-transitory computer-readable media for carrying or having computer-executable instructions or data structures stored thereon. Such computer-readable media can be any available media that can be accessed by a general purpose or special purpose computer. By way of example, such computer-readable media can comprise RAM, ROM, EPROM, EEPROM, CD-ROM, magnetic disk storage or other storage devices, or any other medium which can be used to carry or store desired program code in the form of computer-executable instructions and which can be accessed by a general purpose or special purpose computer. The computer readable instructions can also be accessed from memory and executed by a processor.

It may be noted that the above-described examples of the present solution is for the purpose of illustration only. Although the solution has been described in conjunction with a specific embodiment thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The invention claimed is:

1. A method for testing a plurality of cloud service components on a cloud platform, comprising:
   listing a plurality of simulation tools on the cloud platform, wherein each listed simulation tool of the plurality of simulation tools corresponds to a cloud service component of the plurality of cloud service components included in a cloud service topology;
   configuring the plurality of simulation tools on the cloud platform;
   using the plurality of simulation tools to test the plurality of cloud service components upon inclusion of each cloud service component in the cloud service topology created on the cloud platform;
   adding a new cloud service component to the topology; and
   testing the new cloud service component automatically when the new cloud service component is added to the topology.

2. The method of claim 1, wherein the listed plurality of simulation tools is relevant for testing the plurality of cloud service components.

3. The method of claim 1, wherein the simulation tool automatically tests the each of the plurality of cloud service components upon inclusion of said plurality of cloud service components in the cloud service topology.

4. The method of claim 1, further comprising using the simulation tool to test the each of the plurality of cloud service components prior to inclusion of each cloud service component in a cloud service offered via the cloud platform.

5. A system, comprising:
a plurality of cloud service components included on a cloud platform;
a plurality of simulation tools configured on the cloud platform, wherein each simulation tool of the plurality of simulation tools is used to validate a cloud service component of the plurality of cloud service components included on a cloud service topology created on the cloud platform prior to using said cloud service topology via the cloud platform; and
the cloud platform including machine executable instructions executable on a processor, the processor to:
list the plurality of simulation tools on the cloud platform;
add a new cloud service component to the cloud service topology; and
test the new cloud service component automatically when the new cloud service component is added to the cloud service topology.

6. The system of claim 5, wherein the plurality of simulation tools are used to validate the plurality of cloud service components prior to publication of said plurality of cloud service components included on the cloud service topology on the cloud platform.

7. The system of claim 5, further comprising a cloud service designer module for creating the cloud service topology on the cloud platform.

8. The system of claim 5, wherein the list of the plurality of simulation tools is listed for selection by a user upon creation of the cloud service topology on the cloud platform.

9. The system of claim 5, wherein the cloud platform is a private cloud, a public cloud, or a hybrid cloud.

10. A non-transitory machine-readable storage medium comprising instructions executable by a processor to:
configure a plurality of test services on a cloud platform;
list the plurality of test services on the cloud platform, wherein each listed test service of the plurality of test services corresponds to a cloud service component of a plurality of cloud service components included in a cloud service topology of the cloud platform;
configure the plurality of test services on the cloud platform;
test the plurality of cloud service components using the plurality of test services upon inclusion of each cloud service component in the cloud service topology on the cloud platform;
add a new cloud service component to the cloud service topology; and
test the new cloud service component automatically when the new cloud service component is added to the cloud service topology.

11. The storage medium of claim 10, wherein the plurality of test services are used to test a functional, performance or security feature of the cloud service component.

12. The storage medium of claim 10, wherein the plurality of cloud service components are imported to the cloud platform.

13. The storage medium of claim 10, further comprising instructions to report test results of the test on the new cloud service component.

14. The storage medium of claim 10, wherein the plurality of test are virtual services that simulate a real service behavior of a resource required by the plurality of cloud service components.

* * * * *